(12) United States Patent
Gardner et al.

(10) Patent No.: US 6,323,561 B1
(45) Date of Patent: Nov. 27, 2001

(54) SPACER FORMATION FOR PRECISE SALICIDE FORMATION

(75) Inventors: Mark I. Gardner, Cedar Creek; Fred N. Hause; Charles E. May, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/987,455

(22) Filed: Dec. 9, 1997

(51) Int. Cl.[7] .................................................. H01L 27/088
(52) U.S. Cl. ....................... 257/900; 257/344; 257/366; 257/382; 257/384
(58) Field of Search ......................... 257/900, 336, 257/344, 382, 384

(56) References Cited

U.S. PATENT DOCUMENTS

| 4,949,136 | * | 8/1990 | Jain | 257/344 |
| 5,089,865 | | 2/1992 | Mitsui et al. | |
| 5,424,571 | * | 6/1995 | Liou | 257/344 |
| 5,679,606 | | 10/1997 | Wang et al. | |
| 5,844,284 | * | 12/1998 | Liu | 257/382 |

FOREIGN PATENT DOCUMENTS

| 01143358 | 6/1989 | (JP) . |
| 04079336 | 3/1992 | (JP) . |
| 06168955 | 6/1994 | (JP) . |
| 07307465 | 11/1995 | (JP) . |

OTHER PUBLICATIONS

Tapered Sidewall Field–Effect Transistor Gates, IBM Technical Disclosure Bulletin, vol. 29, No. 7, p. 2913, Dec. 1986.*

* cited by examiner

*Primary Examiner*—Sara Crane
*Assistant Examiner*—Thien F. Tran

(57) ABSTRACT

The formation of a spacer for precise salicide formation is disclosed. In one embodiment, a method includes four steps. In the first step, at least one first spacer is formed, where each spacer is adjacent to an edge of a gate on a substrate and has a triangular geometry. In the second step, an ion implantation is applied to form a graded lightly doped region within the substrate underneath each spacer, the region corresponding to the triangular geometry of the spacer. In the third step, at least one second spacer is formed, where each second spacer overlaps a corresponding first spacer. In the fourth step, a metal silicide within the substrate is formed immediately adjacent to each second spacer.

4 Claims, 6 Drawing Sheets

SPACER FORMATION FOR PRECISE SALICIDE FORMATION

RELATED APPLICATIONS

This application is related to the co-filed and commonly assigned application entitled "Spacer Formation for Graded Dopant Profile Having Triangular Geometry," which is hereby incorporated by reference.

FIELD OF THE INVENTION

The present invention relates generally to integrated circuit manufacturing and more particularly to the formation of a spacer for precise salicide formation.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and the drain are formed by introducing dopants of a second conductivity type (P or N) into a semiconductor substrate of a first conductivity type (N or P) using a patterned gate as a mask. This self-aligning procedure tends to improve packing density and reduce parasitic overlap capacitances between the gate and the source and drain.

Polysilicon (also known as polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anistropically etched to provide a gate that provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3 volts), the electric field in the channel near the drain tends to increase. If the electric field becomes strong enough, it can give rise to so-called hot-carrier effects. For example, hot electrons can overcome the potential energy barrier between the substrate and the gate insulator, causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). An LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source—unless bidirectional current is used—however, lightly doped regions are typically formed for both the source and the drain to avoid additional processing steps.

The formation of spacers to create a graded dopant profile within the source and the drain, as found in the prior art, is disadvantageous in that it does not permit control over the graded dopant profile—and thus corresponding performance and reliability characteristics of the IGFET itself. The dopant profile mirrors the profile of the spacer, which as found in the prior art is usually limited to a circular shape, which is less than ideal to form a true graded dopant profile. Furthermore, prior art formation of spacers requires doping of the source and the drain in two separate processing steps—a first step to lightly dope the drain (and correspondingly, the source), and a second step to more heavily dope the drain and the source regions. Thus, prior art formation of spacers suffers from less controllable dopant profiles and complexity in the number of processing steps needed to dope the source and drain regions of an IGFET.

Another problem with prior art IGFETs specific to salicide-gate MOSFETs is the closeness of the metal silicide layers over highly doped regions to the metal silicide layer over the polysilicon gate. This may result in undesirable electrical fields between these regions. In a salicide-gate MOSFET, typically the metal silicide is formed within the highly doped regions immediately adjacent to the spacers used to form the underlying lightly doped regions. That is, the spacers used to form the underlying lightly doped regions also define the placement of metal silicide within the highly doped region. To further distance the metal silicide within the highly doped regions from the polysilicon gate, these spacers themselves would have to be widened. However, widening the spacers may affect the performance and reliability characteristics of the IGFET itself. Thus, prior art formation of metal silicide within the highly doped regions may result in difficult and perhaps unsolvable design issues for semiconductor designers.

SUMMARY OF THE INVENTION

The above-identified problems, shortcomings, and disadvantages found in the prior art are addressed by the present invention, which will be understood by reading and studying the specification. The invention relates to the formation of a spacer for precise salicide formation. In one embodiment, a method includes four steps. In the first step, at least one first spacer is formed, where each spacer is adjacent to an edge of a gate on a substrate and has a triangular geometry. In the second step, an ion implantation is applied to form a graded lightly doped region within the substrate underneath each spacer, the region corresponding to the triangular geometry of the spacer. In the third step, at least one second spacer is formed, where each second spacer overlaps a corresponding first spacer. In the fourth step, a metal silicide within the substrate is formed immediately adjacent to each second spacer.

The invention thus provides for advantages over the prior art. First, the first spacer has a triangular geometry, such that the lightly doped drain region corresponds to this geometry.

A triangular geometry can be formed via a high density plasma (HDP) reactor that deposits spacer material and concurrently etches the material via a sputter component. The triangular geometry is favorably compared to prior art circular geometries in that it lends a more controlled graded LDD; for example, controlling the sputter component permits different aspect profiles of the resulting triangular geometry. The triangular geometry itself provides for better performance and reliability characteristics of the IGFET of which it is a part as well because it is more truly a graded LDD than those of the prior art. Furthermore, the doping of the drain region is accomplished in one step under the invention, as opposed to two steps as found in the prior art.

In addition, the second spacer is used to further distance the metal silicide within the highly doped regions from the metal silicide within polysilicon gate, as may be required by the semiconductor device designer. That is, the placement of the metal silicide within the highly doped regions is controlled not only by the first spacer, but also by the second spacer as well. This makes the placement of the metal silicide more independent from the formation of the first spacer, such that what would be conflicting design issues in the prior art are instead easily resolved. For example, if the placement of metal silicide requires a wider spacer than needed for an optimal graded lightly doped region, a first spacer may be used for the optimal graded lightly doped region, and a second spacer may be used for the placement of the metal silicide.

The present invention describes methods, devices, and computerized systems of varying scope. In addition to the aspects and advantages of the present invention described here, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
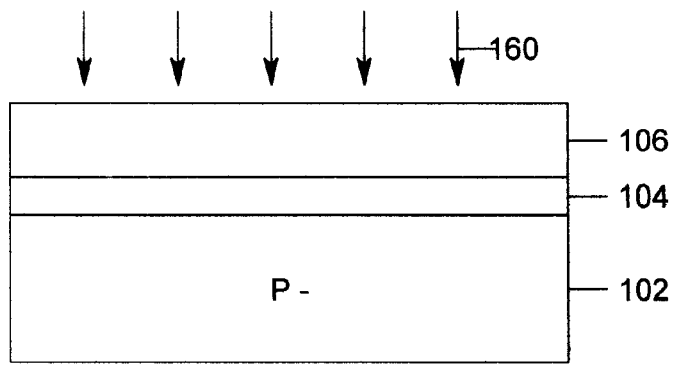
FIGS. 1A–1I show cross-sectional views of successive process steps for making an IGFET in accordance with one embodiment of the invention.

Described first is an IGFET known as a salicide-gate MOS. In FIG. 1A, silicon substrate 102 suitable for integrated circuit manufacture includes P-type epitaxial layer with a boron background concentration on the order of $1\times10^{16}$ atoms/cm$^3$, a<100> orientation and a resistivity of 12 ohm-cm. Desirably, the epitaxial surface layer is disposed on a P+ base layer, not shown, and includes a planar top surface. Gate oxide 104, comprised of silicon dioxide, is formed on the top surface of substrate 102 using oxide tube growth at a temperature of 700° to 1000° C., in an O$_2$ containing ambient. A typical oxidation tube contains several sets of electronically powered heating coils surrounding the tube, which is either quartz, silicon carbide, or silicon, desirably. In O$_2$ gas oxidation, the wafers are placed in the tube in a quartz "boat" or "elephant," and the gas flow is directed across the wafer surfaces to the opposite or exhaust end of the tub. Gate oxide 104 has a thickness of 50 angstroms, desirably.

Thereafter, a blanket layer of undoped polysilicon 106 is deposited by low pressure chemical vapor deposition (LPCVD) on the top surface of gate oxide 104. Polysilicon 106 has a thickness of 2000 angstroms, desirably. If also desired, polysilicon 106 can be doped in situ as deposition occurs, or doped before a subsequent etch step by implanting arsenic with a dosage in the range of $5\times10^{14}$ to $5\times10^{15}$ atoms/cm$^3$, and an energy in the range of 2 to 80 keV. However, it is generally desired that polysilicon 106 be doped during an implantation step following a subsequent etch step.

In FIG. 1A, the polysilicon 106 deposited on the substrate 102 is implanted with arsenic ions and then with nitrogen ions, as depicted by arrows 160. The arsenic ions enhance the rate of silicon dioxide growth in subsequent oxidation processes used to add or grow an additional layer of silicon dioxide. The arsenic ion implant has a dosage in the range of $5\times10^{14}$ to $5\times10^{15}$ atoms/cm$^3$, and an energy level ranging between about 2 to 80 keV. Doping with nitrogen is optional. The arrows 160 depict either the single step of doping with arsenic ions, or the two steps of doping with arsenic and then doping with nitrogen ions. The nitrogen ions may be added to retard the diffusion of the arsenic atoms. If the polysilicon is to be doped with nitrogen ions, the polysilicon may be implanted at this point in the process at a dosage of $5\times10^{14}$ to $5\times10^{15}$ atoms/cm$^3$, and at an energy level of 20 to 200 keV. Nitrogen ions may be implanting after etching the polysilicon.

Figure 1B:
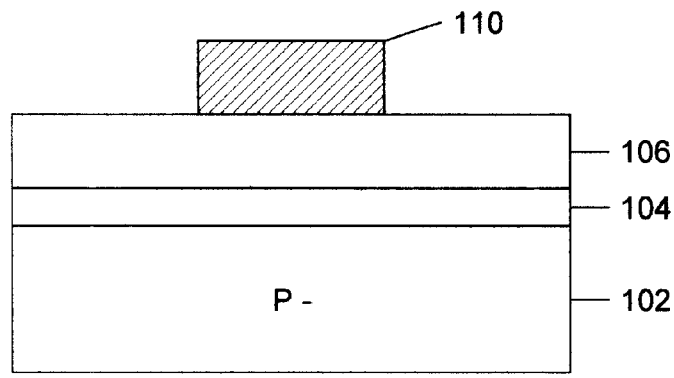

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
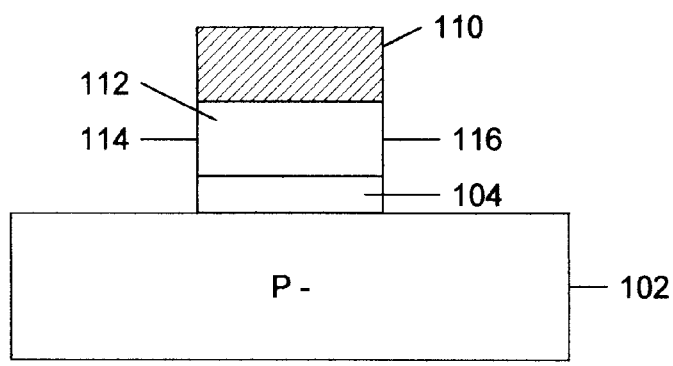

In FIG. 1C, an anisotropic etch is applied that removes the exposed portions of polysilicon 106 and the underlying portions of gate oxide 104. Desirably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls (or, edges) 114 and 116. Polysilicon gate 112 has a length (between sidewalls 114 and 116) of 3500 angstroms, desirably.

Figure 1D:
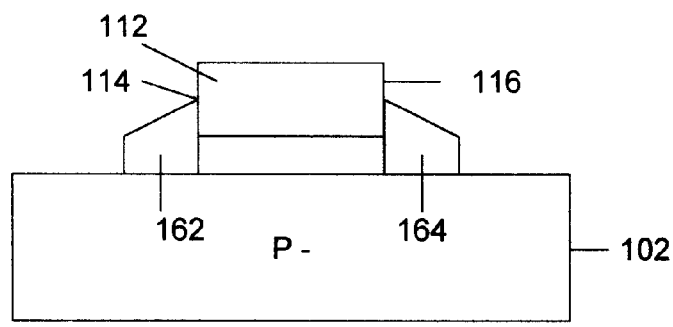

In FIG. 1D, photoresist 110 is stripped, and spacers 162 and 164 are formed, desirably but not essentially by using a high-density plasma (HDP) reactor to simultaneously deposit and etch material to form each spacer, as will be subsequently described in more detail in conjunction with FIGS. 2A–2D. The material from which each spacer is formed is desirably oxide, nitride, or oxynitride. Spacers 162 and 164 as shown in FIG. 1D have a triangular geometry; the triangle (that is, its aspect ratio) is formed to have a predetermined angle, pursuant to the desired performance and reliability characteristics of the IGFET. Such angles include forty-five, thirty, and sixty degrees.

Figure 1E:
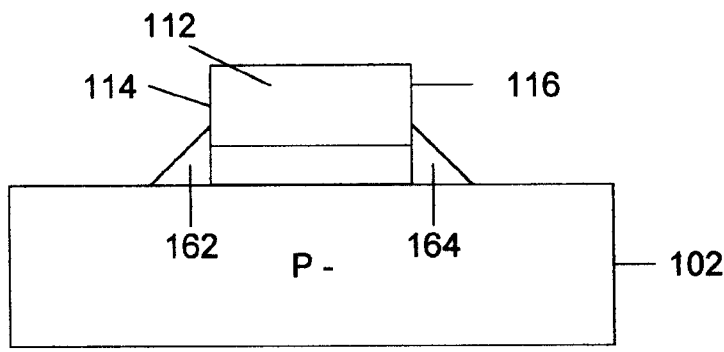

In FIG. 1E, spacers 162 and 164 are desirably but optionally anistropically etched to reduce their profile, while maintaining their triangular geometries, also pursuant to desired performance and reliability characteristics of the IGFET. For example, in one embodiment, each of spacers 162 and 164 has a width of 100–400 angstroms.

Figure 1F:
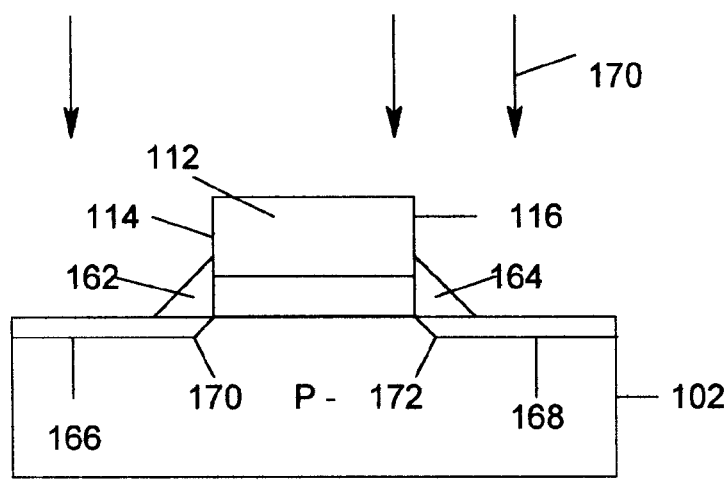

In FIG. 1F, regions 166 and 168 are implanted into substrate 102 by subjecting the structure to ion implantation, such as of arsenic or boron, as indicated by arrows 169, at a dose desirably in the range of about $5 \times 10^{13}$ atoms/cm$^3$ to about $2 \times 10^{15}$ atoms/cm$^3$. Polysilicon gate 112 provides an implant mask for the underlying portion of substrate 102. Furthermore, regions 170 and 172 underneath spacers 162 and 164, respectively, are lightly doped in a graded manner, having a profile that corresponds (i.e., mirrors) the triangular geometries of spacers 162 and 164. Spacers 162 and 164 act as ion implantation gradients, in that they allow some but not all of the ion implantation to seep through and reach the underlying substrate 102. Where the height of spacers 162 and 164 is the greatest (i.e., closest to gate 112), the doping of regions 170 and 172 is the least, and where the height of spacers 162 and 164 is the least (i.e., farthest from gate 112), the doping of regions 170 and 172 is the greatest. The graded lightly doped regions 170 and 172 reduce the electrical field present at each sidewall 114 and 116 of gate 112.

Figure 1G:
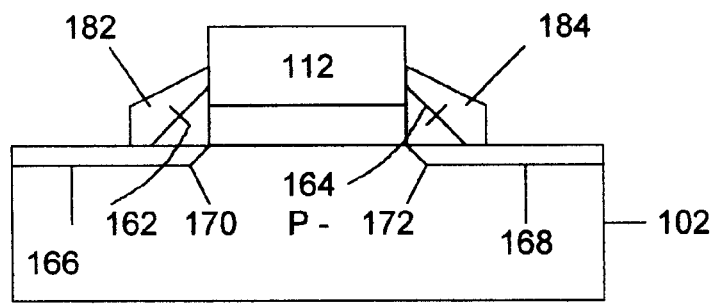

In FIG. 1G, spacers 182 and 184 are formed overlapping corresponding spacers 162 and 164, desirably but not essentially by using a high-density plasma (HDP) reactor to simultaneously deposit and etch material to form each spacer 182 and 184, as will be subsequently described in more detail in conjunction with FIGS. 2A–2D. The material from which each spacer is formed is desirably oxide, nitride, or oxynitride; in one embodiment spacers 182 and 184 are formed from a material different than that from which spacers 162 and 164 are formed. Spacers 182 and 184 as shown in FIG. 1G have a triangular geometry; the triangle (that is, its aspect ratio) is formed to have a predetermined angle, pursuant to the desired performance and reliability characteristics of the IGFET. Such angles include forty-five, thirty, and sixty degrees.

Figure 1H:
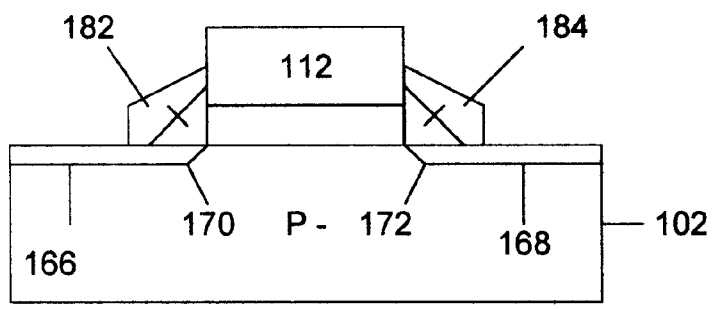

In FIG. 1H, spacers 182 and 184 are desirably but optionally anistropically etched to reduce their profile, while maintaining their triangular geometries, also pursuant to desired performance and reliability characteristics of the IGFET. For example, in one embodiment, each of spacers 182 and 184 has a width of 200–800 angstroms (i.e., including the width of spacers 162 and 164).

Figure 1I:
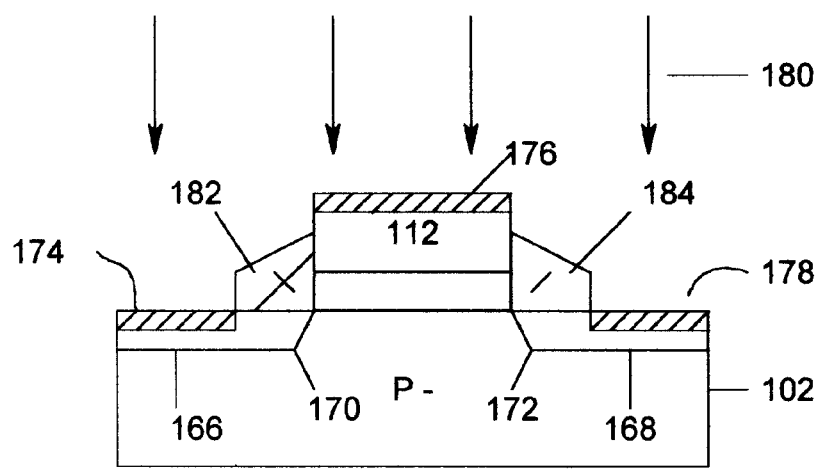

In FIG. 1I, refractory metal is deposited, as represented by arrows 180. Examples of such refractory metal include cobalt and titanium. Metal silicide layers 174, 176 and 178, adjacent to each spacer 182 and 184, are formed by reaction with the underlying polysilicon (i.e., regions 166 and 168, and gate 112) by an alloying process. The removal of the unreacted refractory metal is then removed from the wafer surface. Not shown in FIG. 1I are the conventional processing steps of placing glass over the surface, and forming a contact opening for subsequently placed connectors. A passivation layer may also then be deposited as a top surface. Additionally, the principal processing steps disclosed herein may be combined with other steps apparent and known to those skilled in the art.

The result of steps as described in conjunction with FIGS. 1A–1I is an IGFET having graded lightly doped regions 170 and 172, such that the regions 170 and 172 are most lightly doped adjacent to sidewalls 114 and 116, and most heavily doped adjacent to doped regions 166 and 168. The profile of regions 170 and 172 mirrors that of their corresponding spacers 162 and 164, such that controlling the formation of spacers 162 and 164 permits the corresponding control of the profiles of regions 170 and 172. Thus, the angle at which each of regions 170 and 172 slopes from most lightly doped to most heavily doped may be controlled in conjunction with desired performance and reliability characteristics.

Furthermore, the results of steps as described in conjunction with FIGS. 1A–1I is an IGFET in which metal silicide layers 174 and 178 are further distanced from metal silicide layer 176 than they otherwise would be if spacers 182 and 184 were not present. That is, spacers 182 and 184 are second spacers to the first spacers of spacers 162 and 164, acting to precisely place metal silicide layers 174 and 178 within highly doped regions 166 and 168. Precise placement of layers 174 and 178 is provided because the formation of spacers 182 and 184, like the formation of spacers 162 and 164, may be precisely controlled. Thus, the precise placement of layers 174 and 178 may be accomplished as desired by the semiconductor designer, without limitation as to the creation of lightly doped regions 170 and 172.

Figure 2A:
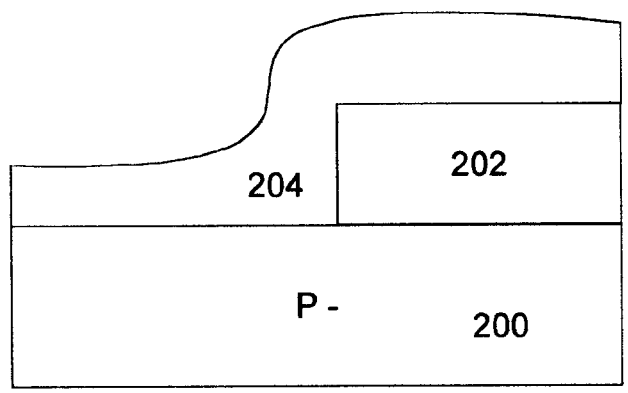
FIGS. 2A–2D show cross-section views comparing the formation of a spacer for a lightly doped drain region according to the prior art, and the formation of a spacer for a lightly doped drain region having a triangular geometry, in accordance with one embodiment of the invention; and, FIG. 3 is a diagram of a computerized system, in accordance with which the invention may be implemented.
Figure 2B:
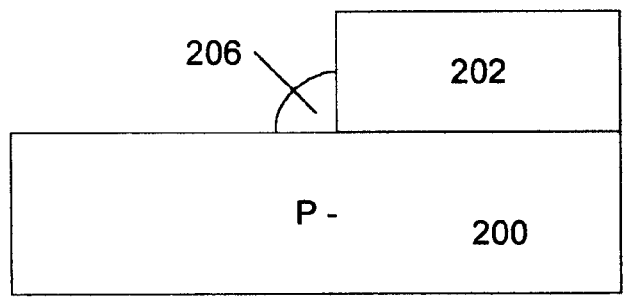
Figure 2C:
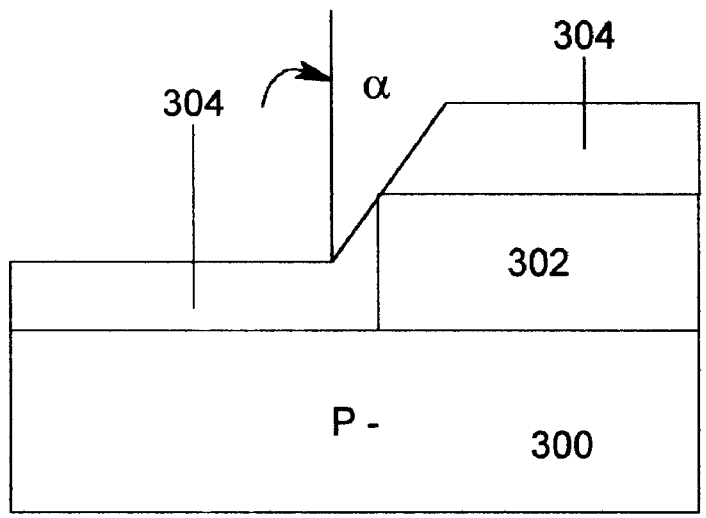

Referring next to FIGS. 2A–2C, the manner by which triangular spacers are formed, in accordance with one embodiment of the invention, is described in comparison to the manner by which circular spacers found in the prior art are formed. In FIG. 2A, a structure having a gate 202 on the top surface of a substrate 200 is subjected to a deposition of a spacer material 204 in accordance with the prior art. The deposition may be accomplished by a typical plasma deposition reactor known as an electron cyclotron resonance (ECR) reactor. This reactor deposits an even layer of spacer material across the exposed top surface of the structure. Thereafter, the spacer material may be anistropically etched to yield prior art spacer 206 as shown in FIG. 2B. Because of the manner in which the spacer material is deposited by the ECR reactor, spacer 206 has a circular geometry.

Figure 2D:
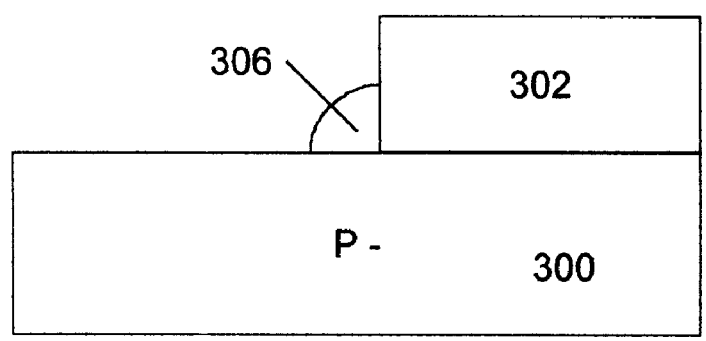

Conversely, in FIG. 2C, a structure having a gate 302 on the top surface of a substrate 300 is subjected to a deposition of a spacer material 304 in accordance with one embodiment of the invention. The deposition is desirably accomplished by a high density plasma (HDP) reactor. While this reactor deposits a layer of spacer material, it concurrently removes spacer material through a sputter component, primarily and most highly concentrated at ninety-degree corners. Thus, spacer material does not remain at ninety-degree corners such as that of gate 302, yielding a spacer material layer that is uneven at the these corners in that it appears "clipped" at an angle alpha. The angle alpha is controllable by adjusting the sputter component within the deposition parameter of the reactor. Thereafter, the spacer material that has been angularly deposited may be anistropically etched to yield an inventive spacer 306 as shown in FIG. 2D, having a triangular geometry.

Figure 3:
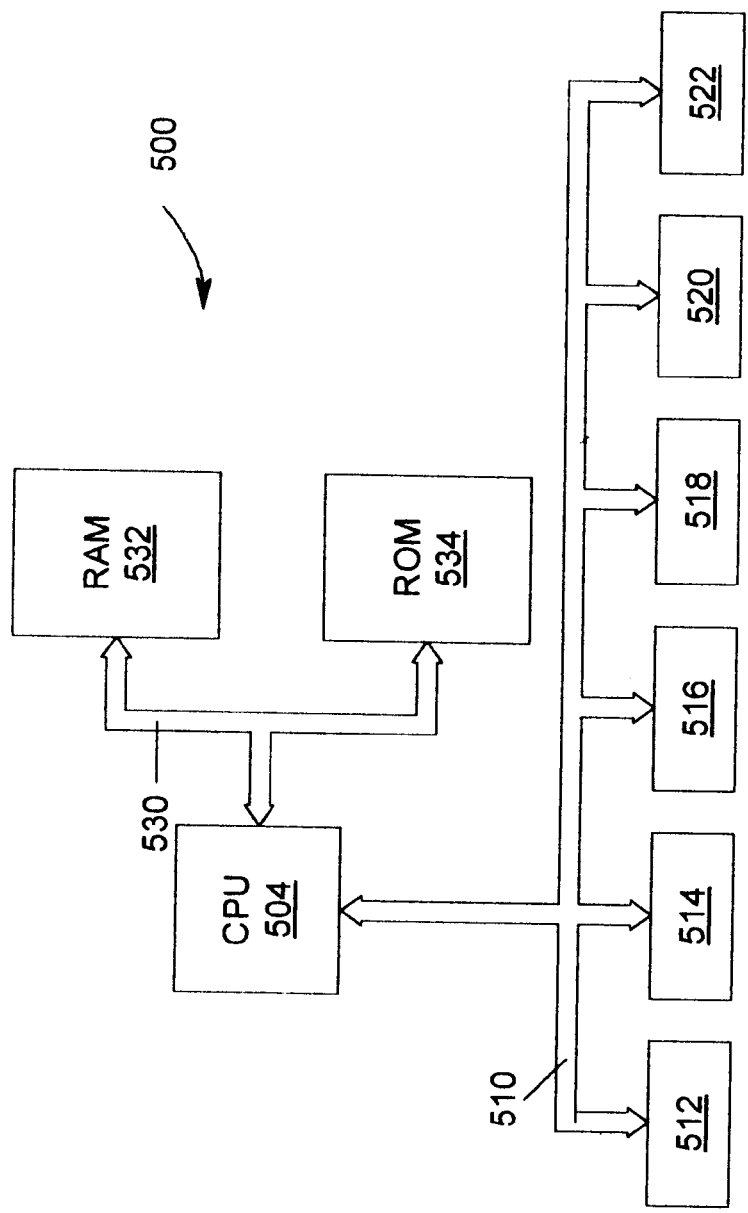

Referring next to FIG. 3, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 500, a random access memory 532, and a system bus 530 for communicatively coupling the central processing unit 504 and the random access memory 532. The system 500 includes a device formed by the steps shown in and described in conjunction with FIGs. 1A–1I. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals. The graded doping regions having a triangular geometry in the device provides for a fast and reliable channel having a long life. Faster channels are needed as clocking speeds for microprocessors increase, and the channel must also be reliable and long-lived.

The formation of a spacer for precise salicide formation has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. A computerized system having at least one semiconductor device comprising:
    at least one first spacer having a triangular geometry, each first spacer adjacent to an edge of a gate over an oxide layer over a semiconductor substrate;
    at least one graded lightly-doped drain region within the substrate, each region underneath a corresponding first spacer such that each graded lightly-doped drain region has a profile that corresponds to the triangular geometry of the first spacer over the region;
    at least one second spacer, each second spacer overlapping a corresponding first spacer, wherein the at least one second spacer has triangular geometry; and
    at least one metal silicide within the substrate immediately adjacent to a corresponding second spacer that spaces the metal silicide from the gate.

2. The computerized system of claim 1, further including at least one highly doped region within the substrate adjacent the at least one graded lightly doped region, wherein the metal silicide is located over the highly doped region and is spaced laterally from the gate as a function of a width of the second spacer.

3. A semiconductor device comprising:
    at least one first spacer having a triangular geometry, each first spacer adjacent to an edge of a gate over an oxide layer over a semiconductor substrate;
    at least one graded lightly-doped drain region within the substrate, each region underneath a corresponding first spacer such that each graded lightly-doped drain region has a profile that corresponds to the triangular geometry of the first spacer over the region;
    at least one second spacer, each second spacer overlapping a corresponding first spacer, wherein the at least one second spacer has triangular geometry; and
    at least one metal silicide within the substrate immediately adjacent to a corresponding second spacer that spaces the metal silicide from the gate.

4. A semiconductor device comprising:
    at least one first spacer having a triangular geometry, each first spacer adjacent to an edge of a gate over an oxide layer over a semiconductor substrate;
    at least one graded lightly-doped drain region within the substrate, the graded lightly-doped region located underneath the first spacer such that the at least one graded lightly-doped drain region has a profile that corresponds to the triangular geometry of the first spacer over the at least one graded lightly-doped drain region;
    at least one second spacer having a triangular geometry, the at least one second spacer overlapping the at least one first spacer;
    at least one highly doped region within the substrate adjacent the at least one graded lightly doped region; and
    at least one metal silicide within the substrate immediately adjacent the at least one second spacer that spaces the metal silicide from the gate and locates the metal silicide over the at least one highly doped region as a function of a width of the second spacer.

* * * * *

UNITED STATES PATENT AND TRADEMARK OFFICE
CERTIFICATE OF CORRECTION

PATENT NO.    : 6,323,561 B1
DATED         : November 27, 2001
INVENTOR(S)   : Gardner et al.

It is certified that error appears in the above-identified patent and that said Letters Patent is hereby corrected as shown below:

<u>Drawings,</u>
FIG. 1F, "170" should read -- 169 --.

Signed and Sealed this

Eleventh Day of June, 2002

*Attest:*

*Attesting Officer*

JAMES E. ROGAN
*Director of the United States Patent and Trademark Office*